(12) United States Patent
Fenouillet-Beranger et al.

(10) Patent No.: US 7,910,419 B2
(45) Date of Patent: Mar. 22, 2011

(54) SOI TRANSISTOR WITH SELF-ALIGNED GROUND PLANE AND GATE AND BURIED OXIDE OF VARIABLE THICKNESS

(75) Inventors: Claire Fenouillet-Beranger, Grenoble (FR); Philippe Coronel, Barraux (FR)

(73) Assignee: Commissariat a l'Energie Atomique, Paris (FR)

( * ) Notice: Subject to any disclaimer, the term of this patent is extended or adjusted under 35 U.S.C. 154(b) by 9 days.

(21) Appl. No.: 12/483,037

(22) Filed: Jun. 11, 2009

(65) Prior Publication Data
US 2009/0311834 A1 Dec. 17, 2009

(30) Foreign Application Priority Data
Jun. 11, 2008 (FR) ...................... 08 53868

(51) Int. Cl.
  *H01L 21/336* (2006.01)
  *H01L 21/8234* (2006.01)
(52) U.S. Cl. ........ 438/197; 438/680; 438/786; 438/787; 257/E21.17; 257/E21.051; 257/E21.058; 257/E21.32; 257/E21.259; 257/E21.267; 257/E21.278; 257/E21.33; 257/E21.332; 257/E21.37
(58) Field of Classification Search .................. 438/197, 438/311, 149, 602, 608, 662, 680, 682, 692, 438/684, 721, 722, 743, 782, 786, 787, 954; 257/E21.17, 51, 58, 32, 332, 33, 37, 267, 257/259, 278
See application file for complete search history.

(56) References Cited

U.S. PATENT DOCUMENTS

| | | | | |
|---|---|---|---|---|
| 5,294,821 A | * | 3/1994 | Iwamatsu | 257/351 |
| 5,641,980 A | * | 6/1997 | Yamaguchi et al. | 257/347 |
| 5,923,067 A | * | 7/1999 | Voldman | 257/349 |
| 6,072,217 A | * | 6/2000 | Burr | 257/351 |
| 2004/0197977 A1 | * | 10/2004 | Deleonibus | 438/202 |
| 2005/0158933 A1 | | 7/2005 | Inoh | |
| 2007/0102761 A1 | | 5/2007 | Inaba et al. | |
| 2007/0148839 A1 | | 6/2007 | Yudasaka | |

OTHER PUBLICATIONS

Dicks, M.H. et al., "A Test Chip to Characterize P-MOS Transistors Produced Using a Novel Organometallic Material", IEEE Proceedings of the 2004 International Conference on Microelecronic Test Structures, vol. 17, pp. 183-187 (Mar. 22-25, 2004).

(Continued)

*Primary Examiner* — David Nhu
(74) *Attorney, Agent, or Firm* — Nixon Peabody LLP

(57) ABSTRACT

A method for making a transistor with self-aligned gate and ground plane includes forming a stack, on one face of a semi-conductor substrate, the stack including an organometallic layer and a dielectric layer. The method also includes exposing a part of the organometallic layer, a portion of the organometallic layer different to the exposed part being protected from the electron beams by a mask, the shape and the dimensions of a section, in a plane parallel to the face of the substrate, of the gate of the transistor being substantially equal to the shape and to the dimensions of a section of the organometallic portion in said plane. The method also includes removing the exposed part, and forming dielectric portions in empty spaces formed by the removal of the exposed part of the organometallic layer, around the organometallic portion.

19 Claims, 16 Drawing Sheets

OTHER PUBLICATIONS

Vandooren, A. et al., "Scaling Assessment of Fully-Depleted SOI Technology at the 30nm Gate Length Generation", 2002 IEEE International SOI Conference, pp. 25-27 (Oct. 7-10, 2002).

Wong, Hon-Sum, "Device Design Considerations for Double-Gate, Ground-Plane, and Single-Gated Ultra-Thin SOI MOSFET's at the 25 nm Channel Length Generation", Electron Devices Meeting, IEDM '98 Technical Digest., International, San Francisco, CA, USA, pp. 407-410 (Dec. 6-9, 1998).

Xiong, W. et al., "Self-Aligned Ground-Plane FDSOI MOSFET", 2002 IEEE International SOI Conference Proceedings, Williamsburg, VA, pp. 23-24 (Oct. 7-10, 2002).

Xiong, W. et al., "Self-aligned Implanted Ground Plane Fully Depleted SOI MOSFET", Electronic Letters, pp. 2059-2060 (Nov. 11, 1999).

Yanagi, Shin-Ichiro, et al., "Proposal of a Partial-Ground-Plane (PGP) Silicon-on-insulator (SOI) MOSFET for Deep sub-0.1-μm Channel Regime", IEEE Electron Device Letters, vol. 22, pp. 278-280 (Jun. 6, 2001).

French Preliminary Search Report, FR 08 53868, dated Feb. 13, 2009.

* cited by examiner

SOI TRANSISTOR WITH SELF-ALIGNED GROUND PLANE AND GATE AND BURIED OXIDE OF VARIABLE THICKNESS

CROSS REFERENCE TO RELATED APPLICATIONS OR PRIORITY CLAIM

This application claims priority of French Patent Application No. 08 53868, filed Jun. 11, 2008.

DESCRIPTION

1. Technical Field

The invention relates to a transistor with buried oxide of variable thickness, and comprising a self-aligned gate and ground plane. The invention also relates to a method for making such a transistor. The invention applies in particular to fully depleted SOI (silicon on insulator) transistors, which can be used for example to make low operating power and high performance logic devices, memories with 1 transistor or RF (radio frequency) analogue devices.

2. State of the Prior Art

The race to reduce the dimensions of transistors entails new constraints that need to be taken into account when making transistors. One of the major problems linked to the miniaturisation of MOSFET transistors is the short channel effect.

To make SOI transistors that comply with the constraints of the 32 nm technological node, the use of a thin buried oxide and a doped ground plane formed under this buried oxide enables short channel effects to be controlled partially.

FIG. 1 represents an example of such a transistor 10. This transistor 10 is of FD-SOI (fully depleted SOI) type and comprises a substrate 12 based on silicon on which are stacked a metal ground plane 14, in which the volume density of dopants is between around $5.10^{18}$ cm$^{-3}$ and $10^{21}$ cm$^{-3}$, a thin film of buried oxide 16 of thickness equal to around 10 nm, and a thin film of silicon 18 of thickness equal to around 5 nm in which are formed or not doped source 20, drain 22 and channel 24 zones. A gate 26 of length for example equal to around 20 nm and a gate oxide 28 of thickness equal to around 1 nm are formed on the thin film of silicon 18.

Nevertheless, such a ground plane formed over the whole length of the transistor has in particular the drawback of increasing the source-substrate and drain-substrate junction capacities of the transistor.

To offset this drawback, the document "Self-Aligned Ground-Plane FDSOI MOSFET" of W. Xiong et al., IEEE International SOI Conference, 2002, pages 23 and 24, describes making a ground plane by implanting dopants (density equal to around $5.10^{18}$ cm$^{-3}$) in the substrate and localised under the gate of the transistor.

Thus, the short channel effects are reduced while at the same time lessening the increase in junction capacities. But this improvement does not enable a transistor to be obtained in which the dynamic performances are satisfactory. In addition, the method for making such a transistor described in the above-cited document entails the implementation of photolithography steps uniquely dedicated to forming the ground plane, substantially increasing the cost of making such a transistor.

DESCRIPTION OF THE INVENTION

Thus there is a need to propose a transistor, for example of SOI type, involving low short channel effects while at the same time reducing the junction capacities presented by this transistor, and having good dynamic performance.

To do this, one embodiment proposes a transistor with self-aligned gate and ground plane, comprising at least:
- a substrate based on at least one semi-conductor,
- a portion of organometallic material, a first face of which is arranged opposite a face of the substrate, forming the ground plane of the transistor,
- a layer based on at least one dielectric material, a first face of which is arranged against one second face of the portion of organometallic material opposite the first face of the portion of organometallic material,
- dielectric portions arranged between the face of the substrate and the first face of the dielectric layer, around the portion of organometallic material, the shape and the dimensions of a section, in a plane substantially parallel to the face of the substrate, of the gate of the transistor being substantially equal to the shape and to the dimensions of a section of the portion of organometallic material in said plane.

Such a transistor thus comprises a ground plane formed by the portion of organometallic material on the substrate and surrounded by a buried oxide of variable thickness formed by the dielectric layer and the dielectric portions formed around the portion of organometallic material. The oxide of variable thickness associated with such a ground plane makes it possible to control short channel effects while at the same time improving the dynamic performance of the transistor linked to the reduction in the source-substrate and drain-substrate junction capacities of said transistor compared to those of the prior art (reduction in the dynamic power consumed and the propagation time).

By virtue of its ground plane formed by a portion of organometallic material, such a device can thus have a non doped channel because of the fact that this ground plane is not made by implantation.

In addition, such a device makes it possible to obtain source/substrate and drain/substrate junctions perfectly controlled vis-à-vis the insulation.

The ground plane of the device may also fulfill other functions. The device moreover makes it possible to create a dissymmetry between the source and drain zones (doping and/or geometric dissymmetries) by performing different injections between the source and drain zones.

Finally, as a function of the materials arranged around the organometallic portion ("all around" silicidation, "all around" contact), it is possible to carry out a rear polarisation of the gate, the source or even the drain. The dielectric material(s) present around the organometallic portions make it possible to form a buried oxide of variable thickness.

The materials arranged around the portion of organometallic material may be different, or of different natures, on one side and the other of the portion of organometallic material, particularly in the case of asymmetric systems.

The organometallic material may be based on platinum and/or palladium.

The dielectric portions may be based on silicon oxide and/or silicon nitride.

The thickness of the dielectric layer may be between around 3 nm and 60 nm or between 10 nm and 50 nm. In addition, the thickness of the dielectric portions may be a function of the envisaged application: ONO (oxide-nitride-oxide) memory, impact on injection, etc., and may in particular be between around 10 nm and 100 nm. It is thus possible to make a transistor fulfilling several functions as a function of the gate dielectric used, which is independent of the dielectric portions that are around the portion of organometallic material forming the ground plane of the transistor (for example a memory function formed by the dielectric portions around the ground plane and logic function formed by the gate of the transistor, or inversely).

The thickness of the portion of organometallic material may be between around 10 nm and 100 nm.

The transistor may further comprise a layer based on at least one semi-conductor, a first face of which may be arranged against a second face of the layer of dielectric material opposite to the first face of the layer of dielectric material, in which may be formed or not doped channel, source and drain zones, the gate of the transistor may be arranged on the side of a second face of the semi-conductor layer opposite to the first face of the semi-conductor layer.

The transistor may further comprise spacers formed around the gate from at least two layers based on different dielectric materials, the dielectric portions may be based on said different dielectric materials. The spacers may be formed from first parts of two layers of different dielectric materials, the dielectric portions may be formed from second parts of the two layers of dielectric materials.

The transistor may further comprise a contact electrically connected to the portion of organometallic material and that may pass through at least the dielectric layer and the gate of the transistor.

The first face of the portion of organometallic material may be arranged against the face of the substrate.

In an alternative, the transistor may further comprise a second layer based on at least one dielectric material arranged between the first face of the portion of organometallic material and the substrate, and between the dielectric portions and the substrate.

Another embodiment relates to a method for making a transistor with self-aligned gate and ground plane, comprising at least the steps of:

a) forming a stack, on one face of a substrate based on at least one semi-conductor, comprising at least one layer based on at least one organometallic material and a layer based on at least one dielectric material, b) exposing by electron beams at least one part of the organometallic layer, a portion of the organometallic layer different to the exposed part of the organometallic layer and intended to form the ground plane of the transistor being protected from the electron beams by a mask, for example formed by the gate of the transistor, during this step of exposure, the shape and the dimensions of a section, in a plane substantially parallel to the face of the substrate, of the gate of the transistor being intended to be substantially equal to the shape and to the dimensions of a section of said portion of organometallic material in said plane, c) removing the exposed part of the organometallic layer.

The method may comprise a step d) of forming dielectric portions in empty spaces formed by the removal of said exposed part of the organometallic layer, between the face of the substrate and the dielectric layer, around said portion of the organometallic layer.

Such a method enables an SOI transistor to be made with self-aligned ground plane and gate, and comprising a buried oxide of variable thickness, not requiring the implementation of photolithography steps specific to forming the buried oxide of variable thickness.

The organometallic material here serves both to form the ground plane of the transistor, as well as to form a selectively removable material used to form the buried oxide of variable thickness.

Finally, thanks to the overlap of the ground plane under the whole of the gate of the transistor, it is possible to form a contact electrically connected to the ground plane without additional photolithography step.

In addition, due to the step of removing the exposed part of the organometallic layer, it is possible to form different types of dielectric portions in the cavities around the ground plane formed (presence of silicide to carry out an "all around" silicidation and/or also source-drain contacts optimising the contact surfaces with the source and drain zones compared to the source-drain contacts conventionally formed above source and drain zones). The materials arranged in the hollows may also be of any type, and depend on the functions that are intended to be fulfilled by the transistor.

The stack formed in step a) may further comprise a layer based on at least one semi-conductor such that the dielectric layer may be arranged between said semi-conductor layer and the organometallic layer.

The method may further comprise, between step a) of forming the stack and step b) of exposure, a step of forming the gate of the transistor on the semi-conductor layer, the gate being able to form the mask protecting the portion of the organometallic layer during step b) of exposure.

The method may further comprise, between the step of forming the gate of the transistor and step b) of exposure, a step of depositing a photosensitive resin layer at least on the gate and on the semi-conductor layer, and a step of mechanical-chemical planarisation of the resin layer while stopping on the gate. Said exposed resin layer may then be transformed by annealing into dielectric material after step b) of exposure.

In an alternative, the method may further comprise, between step a) of forming the stack and step b) of exposure, a step of depositing a photosensitive resin layer at least on the semi-conductor layer of the stack, step b) being also able to carry out the exposure of a part of the photosensitive resin layer. The exposed part of the resin layer may then be transformed into dielectric material.

In this case, the method may further comprise, between step b) of exposure and step c) of removing the exposed part of the organometallic layer, a step of removing the exposed part of the photosensitive resin layer that may also form, in the resin layer, a hollow, then forming the gate by at least one step of depositing at least one gate material in said hollow and on the resin layer and a step of mechanical-chemical planarisation while stopping on the resin layer.

The method may further comprise, between the step of mechanical-chemical planarisation and step c) of removing the exposed part of the organometallic layer, a step of removing the exposed part of the resin layer.

The stack formed in step a) may further comprise a photosensitive resin layer such that the semi-conductor layer may be arranged between said resin layer and the dielectric layer.

The method may further comprise, between step a) of forming the stack and step b) of exposure, a step of forming the mask intended to protect the portion of the organometallic layer during step b) of exposure, on the photosensitive resin layer.

Step b) of exposure may also include the exposure of one part of the photosensitive resin layer, a portion of the photosensitive resin layer, different to said part of the photosensitive resin layer, which may be protected from the electron beams by the mask, for example formed by the gate of the transistor, during this step of exposure, the shape and the dimensions of a section, in a plane substantially parallel to the face of the substrate, of the gate of the transistor may be substantially equal to the shape and to the dimensions of a section of said portion of the photosensitive resin layer in said plane.

The method may further comprise, between step b) of exposure and step c) of removing the exposed part of the organometallic layer, a step of removing the non exposed part of the photosensitive resin layer.

The method may further comprise, between the step of removing the non exposed part of the photosensitive resin layer and step c) of removing the exposed part of the organometallic layer, a step of forming at least one spacer against the lateral walls of a hollow formed in the resin layer by the removal of the non exposed part of the resin layer, this spacer may be intended to form a contour of the gate of the transistor.

The method may further comprise, between the step of forming the spacer in the hollow formed in the resin layer and step c) of removing the exposed part of the organometallic layer, a step of forming a hard mask opposite a part of the semi-conductor layer intended to comprise the source, drain and channel zones of the transistor, a step of removing parts of the resin layer not covered by the hard mask, then a step of oxidising parts of the semi-conductor layer not covered by the hard mask.

The method may further comprise, between the step of oxidising parts of the semi-conductor layer not covered by the hard mask and step c) of removing the exposed part of the organometallic layer, a step of removing the hard mask, then a step of depositing at least one gate material at least inside the contour formed by the spacer, which can thus form the gate of the transistor.

The method may further comprise, between the step of depositing the gate material and step c) of removing the exposed part of the organometallic layer, a step of removing the remaining part of the resin layer and the oxidised parts of the semi-conductor layer.

Step d) of forming dielectric portions may be obtained by the implementation of a step of depositing a first dielectric material at least on the walls of the empty spaces formed by the removal of said exposed part of the organometallic layer and a step of depositing a second dielectric material, different to the first dielectric material, in the remaining space of said empty spaces.

The first and second dielectric materials deposited to form the dielectric portions may also be deposited around the gate, which can thus form spacers.

The stack formed in step a) may further comprise a second dielectric layer arranged between the substrate and the organometallic layer.

The method may further comprise, after step d) of forming dielectric portions, a step of forming at least one electrical contact through at least the dielectric layer and the gate of the transistor, connected to the portion of organometallic material.

Generally speaking, the method described here also makes it possible to form dissymmetries at the source, drain, or channel zones.

BRIEF DESCRIPTION OF DRAWINGS

The present invention will be better understood on reading the description of embodiments, given purely by way of indication and in no way limiting, and by referring to the appended figures in which.

Identical, similar or equivalent parts of the different figures described hereafter bear the same number references so as to make it easier to go from one figure to the next.

In order to make the figures easier to read, the different parts represented in the figures are not necessarily to the same scale.

The different possibilities (alternatives and embodiments) should be understood as not been mutually exclusive and may be combined together.

DETAILED DESCRIPTION OF SPECIFIC EMBODIMENTS

Reference will firstly be made to FIGS. 2A to 2I, which represent the steps of a method for making a fully depleted SOI transistor 100, with buried oxide of variable thickness, and comprising a self-aligned gate and ground plane, according to a first embodiment.

Figure 1:
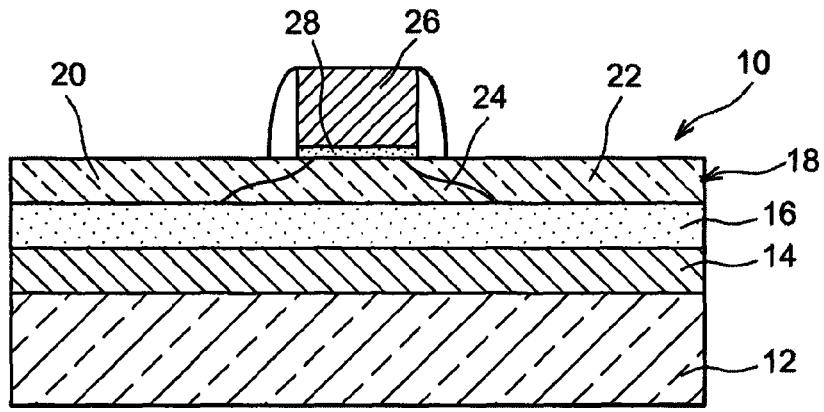
FIG. 1 represents an SOI transistor with thin buried oxide and ground plane according to the prior art.
Figure 2A:
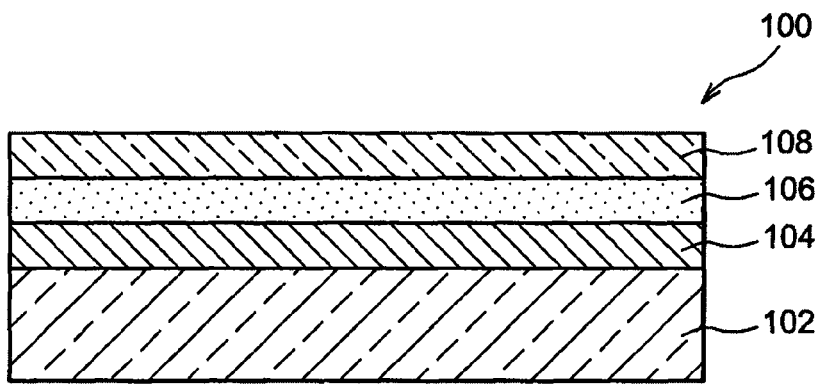
FIGS. 2A to 2I represent the steps of a method for making an SOI transistor with buried oxide of variable thickness and ground plane self-aligned with the gate according to a first embodiment.

As represented in FIG. 2A, firstly is formed, against a face of a semi-conductor substrate 102, for example based on silicon, a photosensitive layer 104 and based on an organometallic material, in other words a compound comprising at least one metal-carbon bond. The metal of this organometallic material may in particular be chosen among the following metals: Pt, Au, Pd, Ag. An organometallic compound based on platinum may for example be $(C_3F_7)_2PtC_9H_{12}$. The organometallic material may also be based on metal oxide (for example: $Al_2O_3$, $TiO_2$, ZnO, $MnO_2$, $ZrO_2$, $RuO_2$, etc.), or instead $BaTiO_3$, BST (barium strontium titanate), PZT (lead zirconate titanate) or instead ITO (indium tin oxide) or any type of organometallic material photosensitive for example to electron beams. This layer 104 may be deposited on the substrate 102 by cathodic sputtering, spin coater deposition, deposition by hot spraying, or any other deposition technique suited to the organometallic material of the layer 104. The organometallic layer 104 may for example have a thickness equal to around 135 nm. The thickness of the organometallic layer 104 obtained depends on the deposition technique used. It is possible to obtain with spin coater deposition an organometallic layer 104 of thickness equal to or greater than 135 nm. A deposition by sputtering makes it possible to obtain thicknesses less than 135 nm. This initial thickness may also depend on transformations or changes of volume carried out subsequent to the deposition of this layer 104.

A dielectric layer 106, for example based on an oxide such as $SiO_2$ and of thickness equal to around 10 nm or between around 1 nm and 10 nm is arranged on the organometallic layer 104. This dielectric layer 106 may also be formed by the high-K or high dielectric constant dielectric (greater than 3.9), and/or the low-K or low dielectric constant dielectric (less than 3.9) and/or TEOS (tetraethoxysilane). A semi-conductor based layer 108 is also arranged on the oxide layer 106 and comprises a thickness equal to around 5 nm or between around 5 nm and 15 nm. The dielectric layer 106 may be deposited by bonding, nanoimprint lithography, or any other appropriate deposition technique on the organometallic layer 104. The semi-conductor based layer 108 may be deposited by CVD (chemical vapour deposition), ALD (atomic layer deposition) or any other appropriate deposition technique on the dielectric layer 106.

Figure 2B:
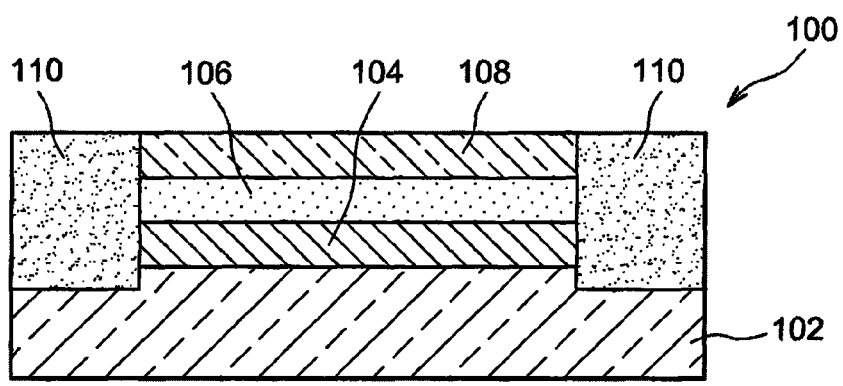

Isolation trenches are then formed through the layers 104, 106, 108 and the substrate 102, delimiting an active zone of the transistor 100 in which are going to be formed in particular source, drain and channel zones, as well as the self-aligned gate and the ground plane. These trenches are then filled by a dielectric material 110, for example based on $SiO_2$ (FIG. 2B).

Figure 2C:
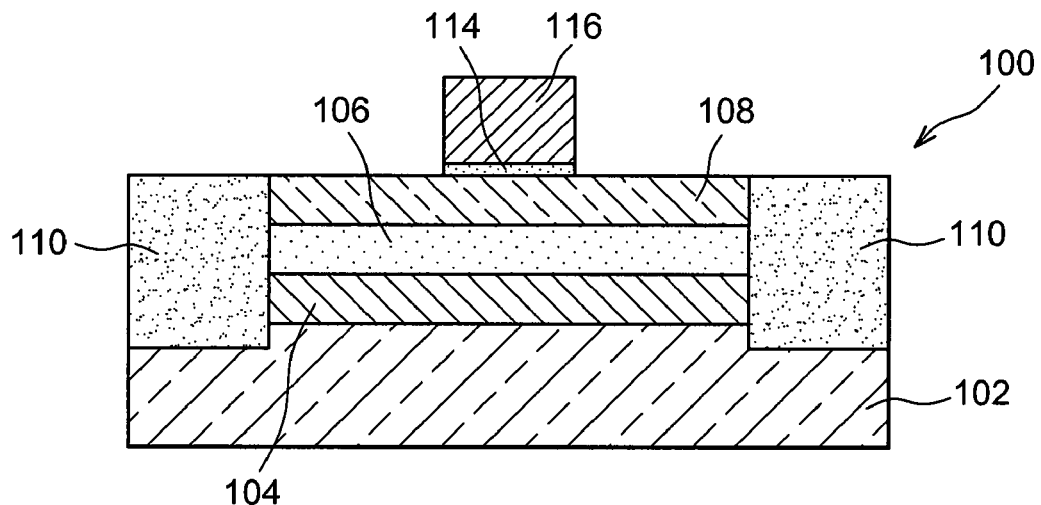

As represented in FIG. 2C, a gate 116 and a gate oxide 114 are formed on the silicon layer 108, for example by forming firstly an oxide layer, for example based on $SiO_2$ and of thickness equal to around 1 nm, and a layer based on a gate material, for example polysilicon, on the silicon layer 108, and of thickness for example equal to 100 nm or between around 50 nm and 150 nm. The gate 116 and the gate oxide 114 are then formed by the implementation of steps of photolithography, masking and etching of the layers of oxide and polysilicon deposited previously.

Figure 2D:
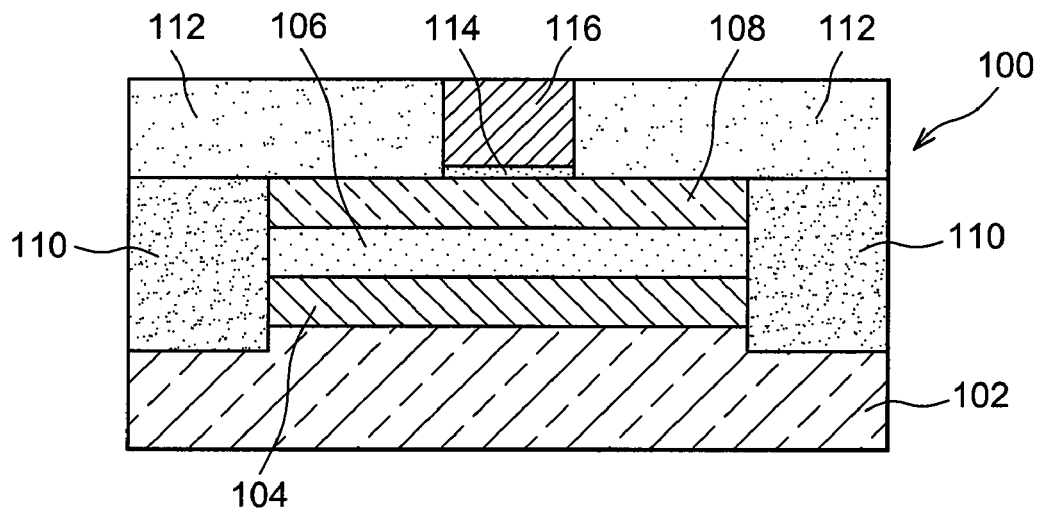

In FIG. 2D, a photosensitive resin layer 112, for example HSQ resin, is then deposited over the whole of the transistor 100, in other words on the silicon layer 108 and the isolation trenches 110, as well as on the gate 116. A step of mechanical-chemical planarisation or mutual flow (as a function of the viscosity of the HSQ resin) with stoppage at the gate 116 is then carried out.

Figure 2E:
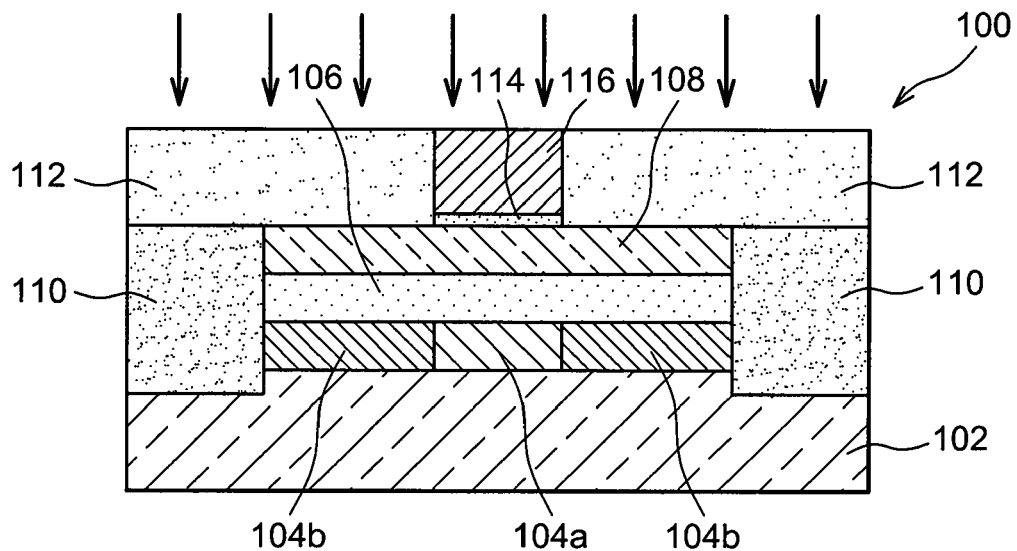

As represented in FIG. 2E, a full layer exposure by electron beams is then carried out, in other words an exposure of the entire transistor 100. The exposed HSQ resin of the layer 112 is then transformed, by annealing, into dielectric thus forming an oxide. The portions 104b of the organometallic layer 104 that are not under the gate 116 are exposed by the electron beams, unlike the portion 104a of the organometallic layer 104 protected by the gate 116 during this exposure step. This exposure thus forms, in the organometallic layer 104, exposed portions 104b that can be later etched selectively compared to the portion 104a protected by the gate 116. The electron beams used may have an energy between around 5 KeV and 100 KeV. The energy of the beams is chosen in particular as a function of the thicknesses of the layers that the electron beams have to pass through.

Figure 2F:
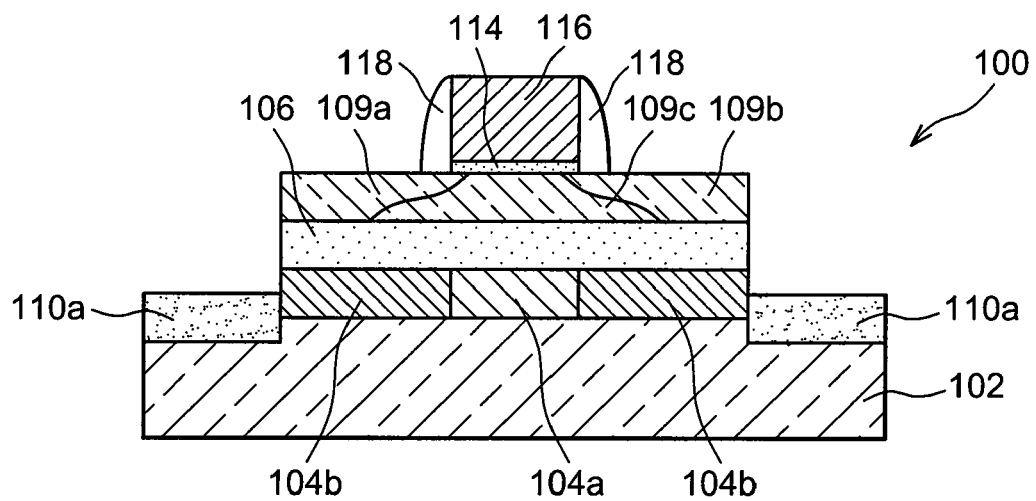

The dielectric material 112 stemming from the HSQ resin layer is then etched. Implantation steps are then implemented to form source 109a and drain 109b zones in the silicon layer 108. A channel 109c is also formed in the silicon layer 108, under the gate 116. Spacers 118 are also formed around the gate 116 and the gate oxide 114. A part of the isolation trenches 110 is then removed, leaving remaining isolation portions 110a at the substrate 102 and exposed portions 104b of the organometallic layer 104 (FIG. 2F).

Figure 2G:
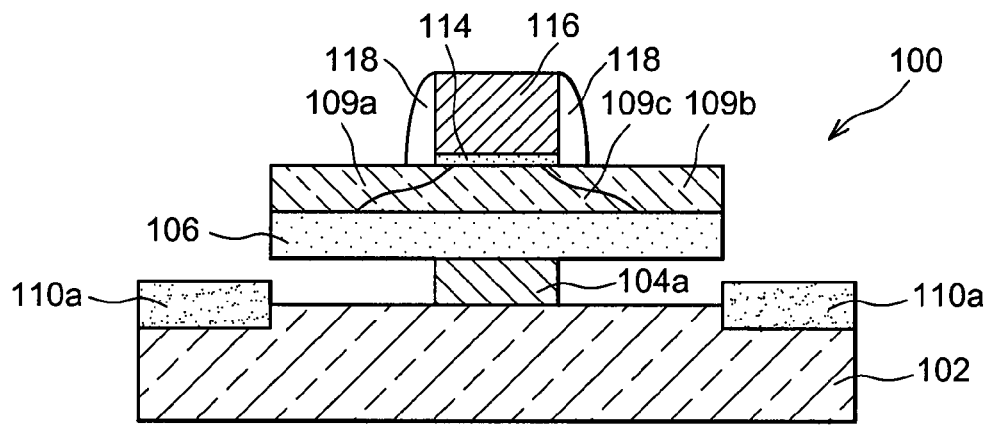

By partially etching the isolation trenches 110, an access to the organometallic layer 104 is formed. The exposed portions 104b of the layer 104 may thus be etched, and leave remaining uniquely the portion 104a that is under the gate 116 (FIG. 2G). Thanks to the exposure previously carried out in the layer 104 with the gate 116 as mask, the remaining non exposed portion 104a forms a ground plane of the transistor 100 self-aligned with the gate 116. Thus, the shape and the dimensions of a section, in a plane substantially parallel to the face of the substrate 102 on which is arranged the portion 104a, of the gate 116 are substantially equal to the shape and to the dimensions of a section of the organometallic portion 104a in this same plane.

Figure 2H:
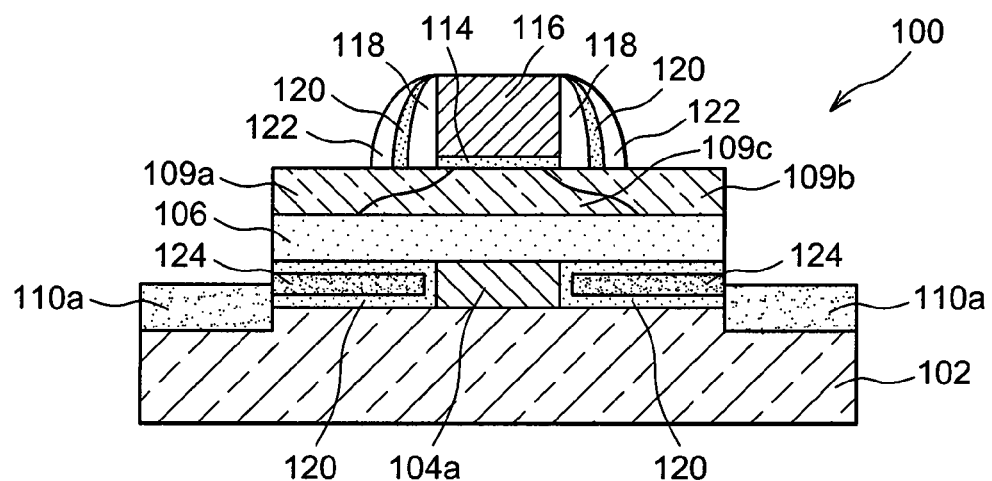

As represented in FIG. 2H, a dielectric based layer 120, for example made of $SiO_2$, is deposited on the spacers 118 as well as on the walls of the hollows formed by the previous removal of the exposed portions 104b. A nitride layer, for example based on silicon nitride, is then deposited on the dielectric layer 120, forming second spacers 122 and portions 124 filling the hollows formed during the removal of the exposed portions 104b. Depositions may be carried out by PECVD (plasma enhanced chemical vapour deposition), LPCVD (low pressure chemical vapour deposition) or instead ALD. Other types of materials (conductors, semi-conductors, for example of polysilicon, of polysilicon-germanium) may also be deposited in the hollows formed. It is thus possible to fulfill different functions depending on the materials deposited in the hollow formed. The nitride 122 and oxide 120 layers may for example have thicknesses between around 10 nm and 30 nm. These thicknesses may in particular be a function of the desired performances of the transistor.

Figure 2I:
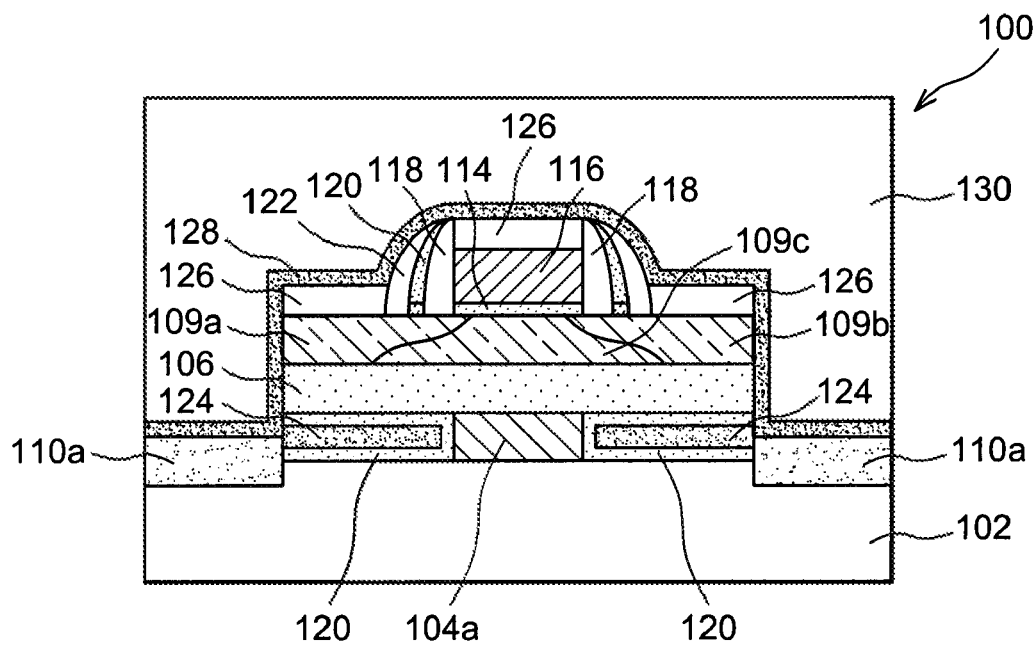

As represented in FIG. 2I, a silicidation of the gate 116, the source 109a and the drain 109b formed previously in the silicon layer 108 is finally carried out, forming portions of silicide 126. A nitride layer 128 and a pre-metal dielectric (PMD) layer 130 are then deposited on the transistor 100 to achieve its electrical isolation. The nitride layer 128 is for example based on SiN, the PMD layer 130 being based on $SiO_2$. The thicknesses of these layers 128 and 130 may be between around 150 nm and 250 nm.

A fully depleted SOI (FD-SOI) transistor 100 is thus obtained when the silicon layer 108 has a thickness less than or equal to around 30 nm. The portion 104a of organometallic material forms a ground plane of the transistor 100 extending uniquely under the gate 116. In addition, the transistor 100 thus formed comprises a buried oxide formed by the layer of $SiO_2$ 106 as well as by the dielectric layer 120 and the portions of nitride 124 deposited in the hollow formed by the removal of the exposed portions 104b of the organometallic layer 104. This buried oxide thus has a variable thickness: this thickness is for example equal to around 145 nm at the source 109a and drain 109b, and equal to around 10 nm at the gate 116. This buried oxide is also formed by portions of materials of different dielectric constants.

In terms of short channel effect (on the DIBL), this transistor makes it possible to gain a factor of 2 compared to known transistors. In addition, this transistor enables a reduction in the junction capacities of around 20% compared to a transistor with thin buried oxide without ground plane.

In this first embodiment, the ground plane 104a is not connected. Nevertheless, in an alternative embodiment, it is possible to form an electrical connection of the ground plane 104a through the PMD 130, the gate 116, the semi-conducting layer 108 and the dielectric layer 106.

A method for making the fully depleted SOI transistor 100, with self-aligned ground plane and gate and buried oxide of variable thickness according to a second embodiment will now be described.

The steps described previously in reference to FIGS. 2A and 2B are firstly implemented.

Figure 3A:
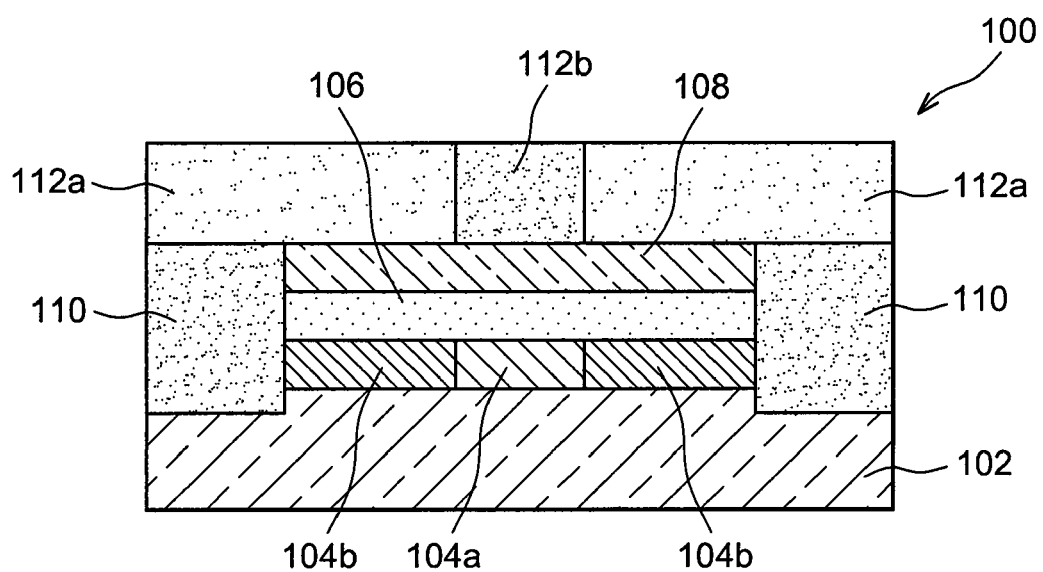
FIGS. 3A and 3B represent the steps of a method for making an SOI transistor with buried oxide of variable thickness and ground plane self-aligned with the gate according to a second embodiment.

As represented in FIG. 3A, the deposition of the resin layer 112 on the silicon layer 108 and on the isolation trenches 110 is then carried out. An exposure by electron beam of the device 100 is then carried out, except at the future gate of the transistor 100. In the HSQ resin layer 112 are thus formed exposed portions 112a and a non exposed portion 112b. The HSQ resin, at the exposed portions 112b, is then transformed by annealing into dielectric material. The electron beams also perform the exposure of the portions 104b of the organometallic layer 104 that are not at the gate of the transistor 100. The portion 104a of the organometallic layer 104 that is under the gate 116 is protected during this exposure.

Figure 3B:
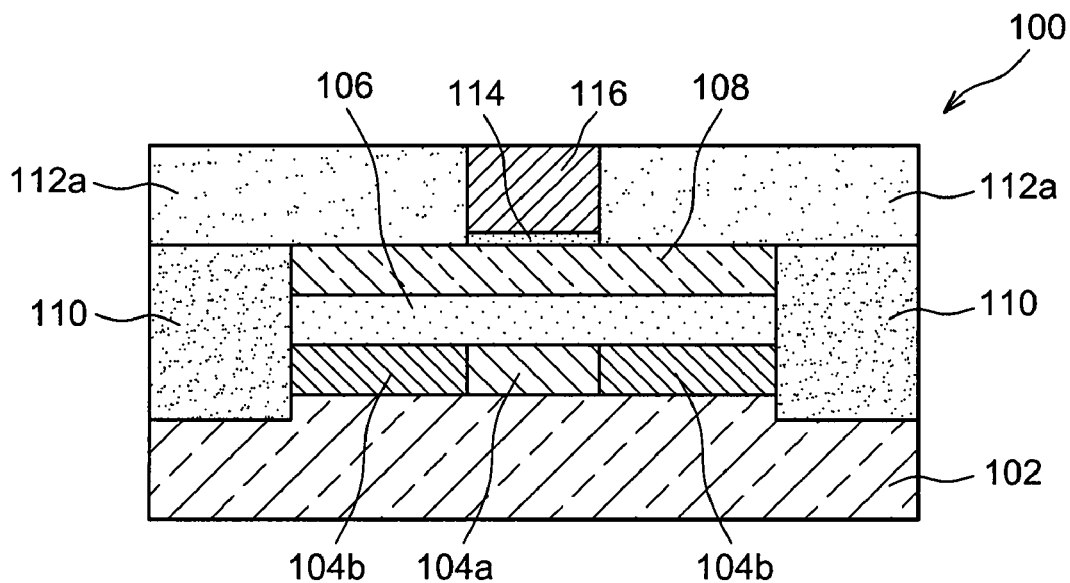

The non exposed portion 112b of the HSQ resin layer 112 is then removed. As represented in FIG. 3B, the gate oxide 114 and the gate 116 are then formed in the space freed by the removal of the portion 112b of resin, by a damascene method (deposition of the gate material in the freed space, the gate material overlapping the dielectric portions 112a, then mechanical-chemical planarisation of the gate material with stoppage on the exposed resin 112a).

The method is then completed by implementing the steps previously described in reference to FIGS. 2F to 2I.

Compared to the first embodiment, the method according to the second embodiment makes it possible to "economise" the steps of photolithography and etching implemented to make the gate in the first embodiment. This second embodiment offers in particular a wide flexibility as regards the choice of the type of resin that can be used (positive or negative resin).

Generally speaking, depending on the polarity of the resin used, it is thus possible to carry out a direct transfer of the ground plane of the transistor under the gate, or to modify the source and drain zones of the transistor.

Figure 4A:
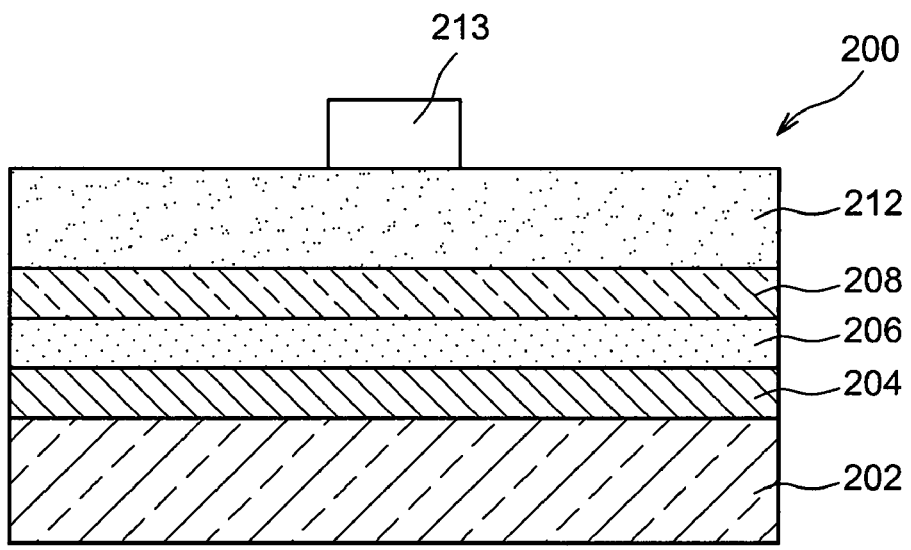
FIGS. 4A to 4U represent the steps of a method for making an SOI transistor with buried oxide of variable thickness and ground plane self-aligned with the gate according to a third embodiment.
Figure 4B:
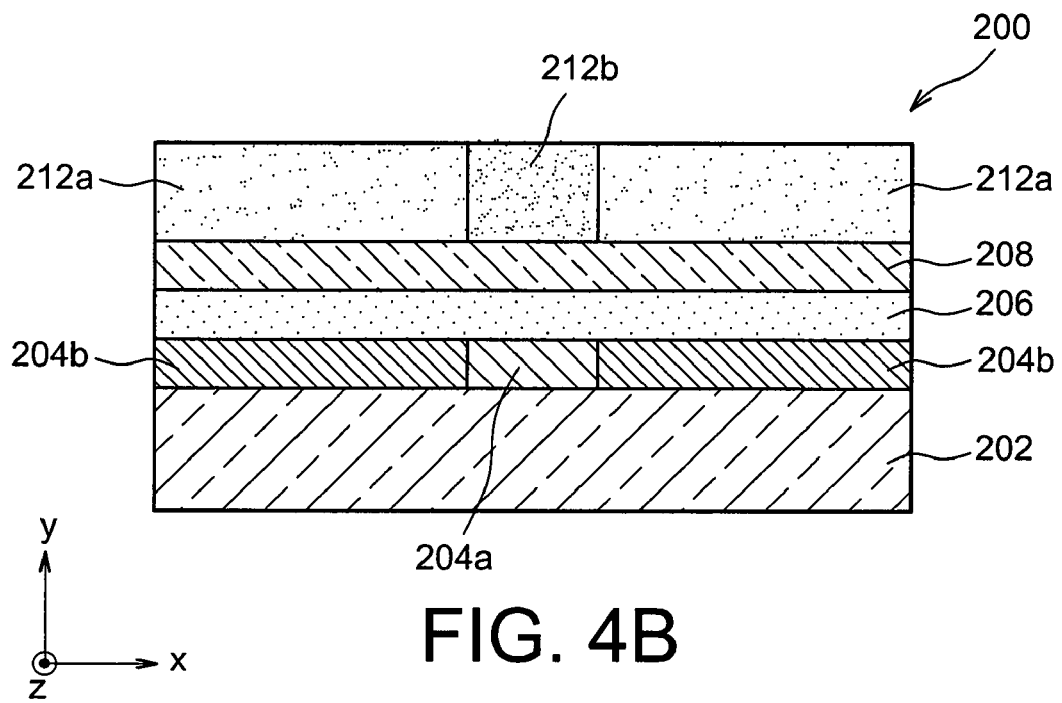
Figure 4C:
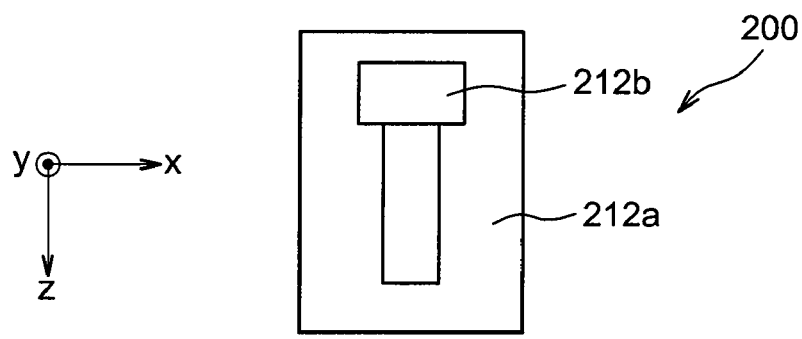
Figure 4D:
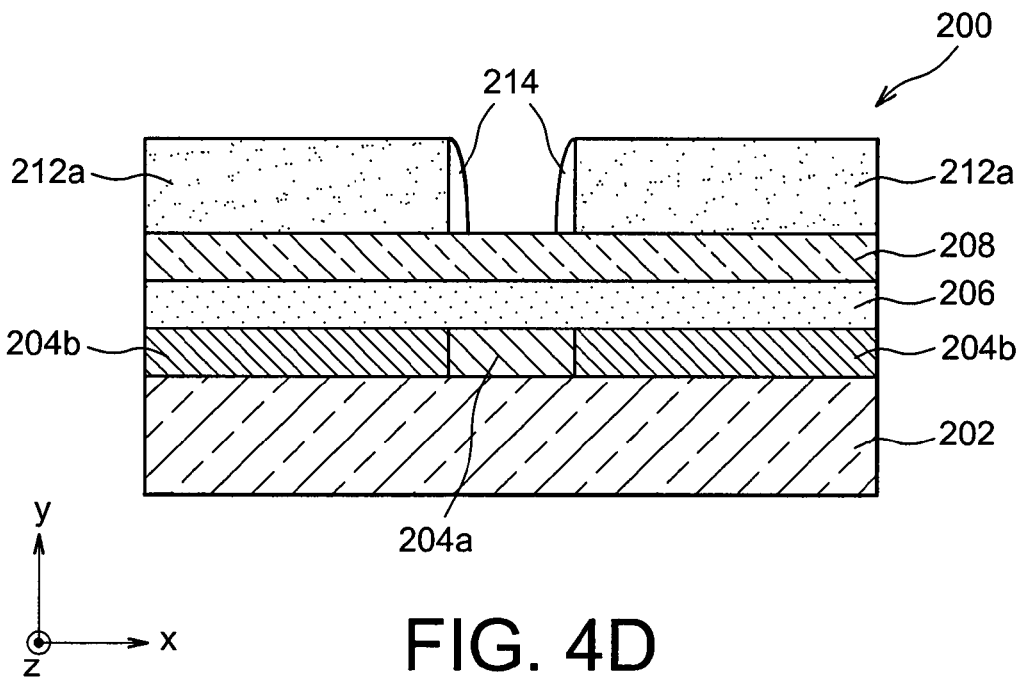
Figure 4E:
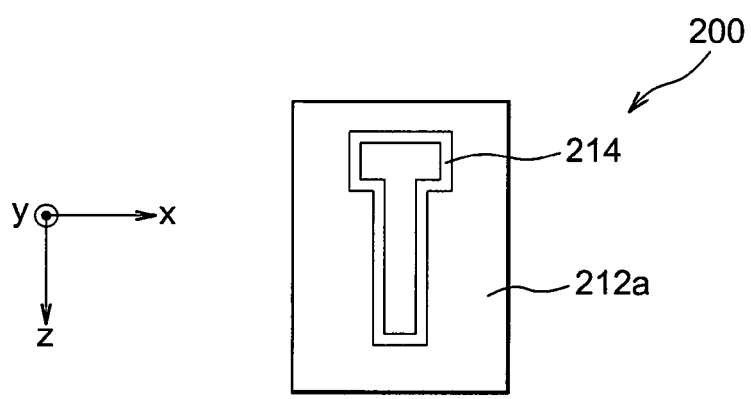
Figure 4F:
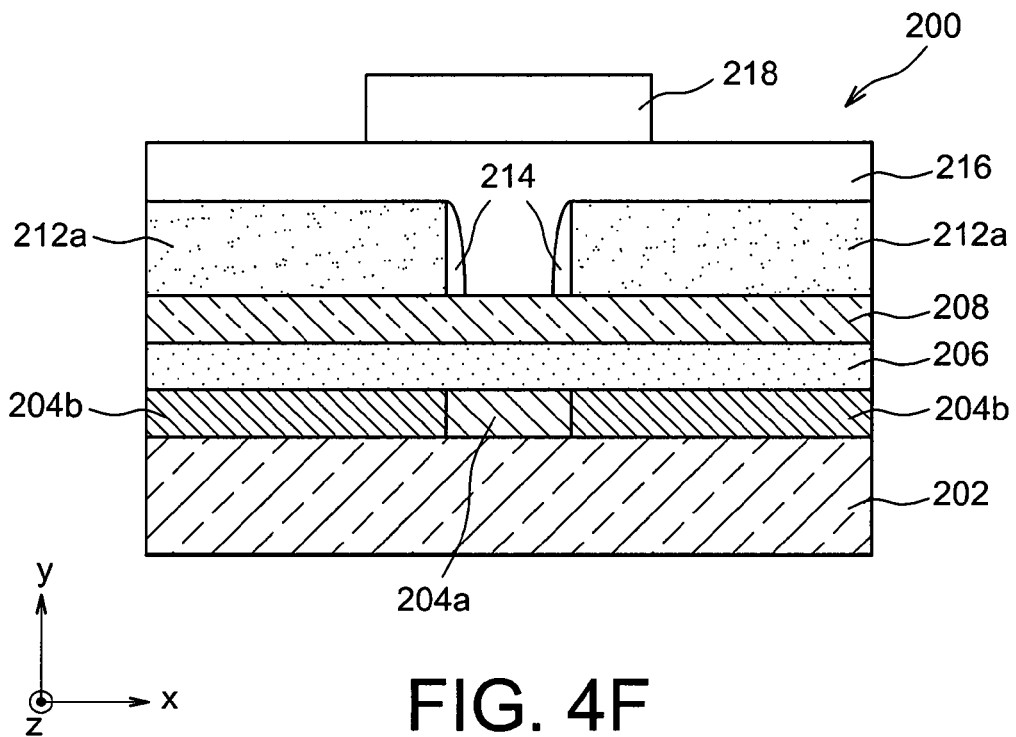
Figure 4G:
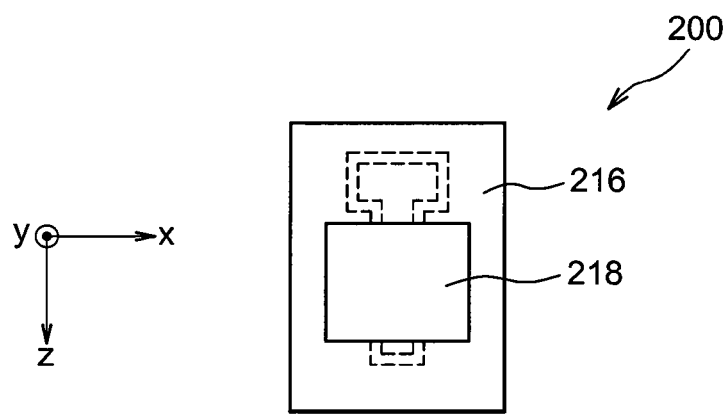
Figure 4H:
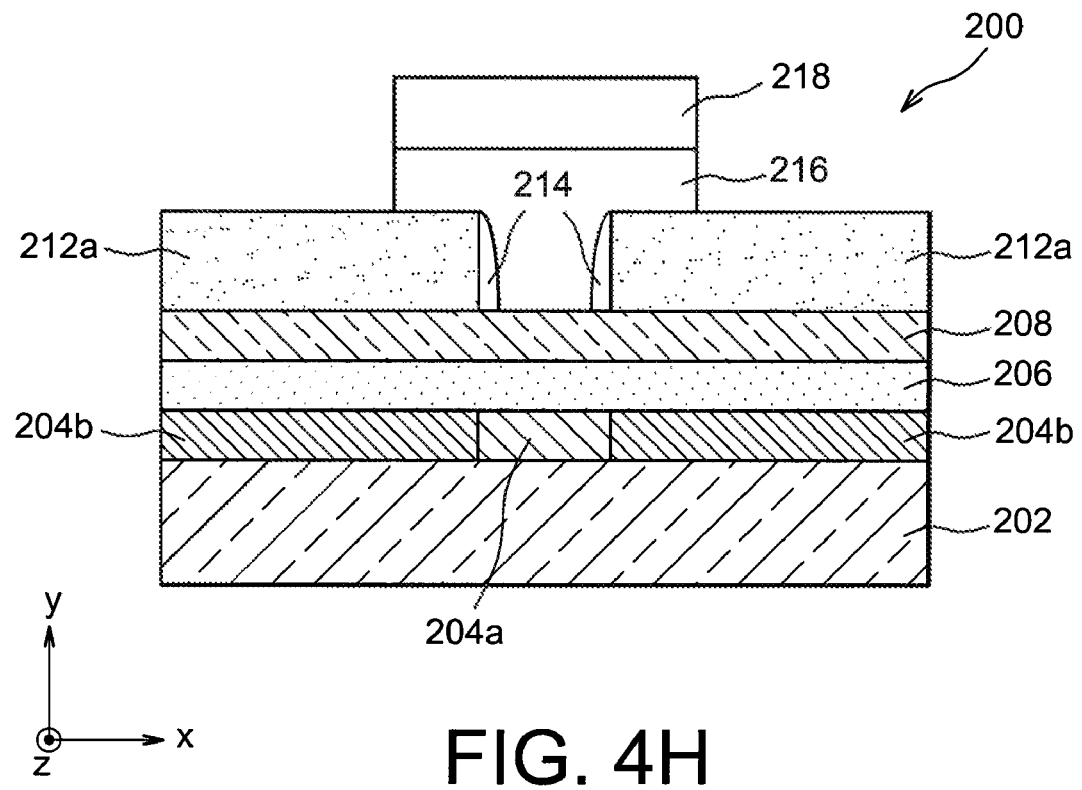
Figure 4I:
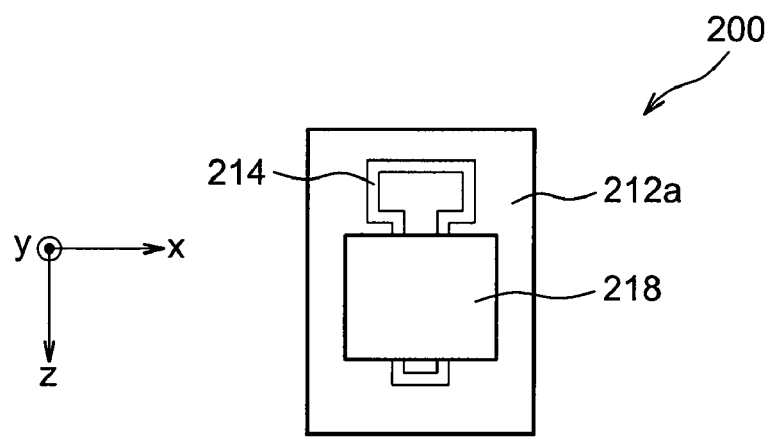
Figure 4J:
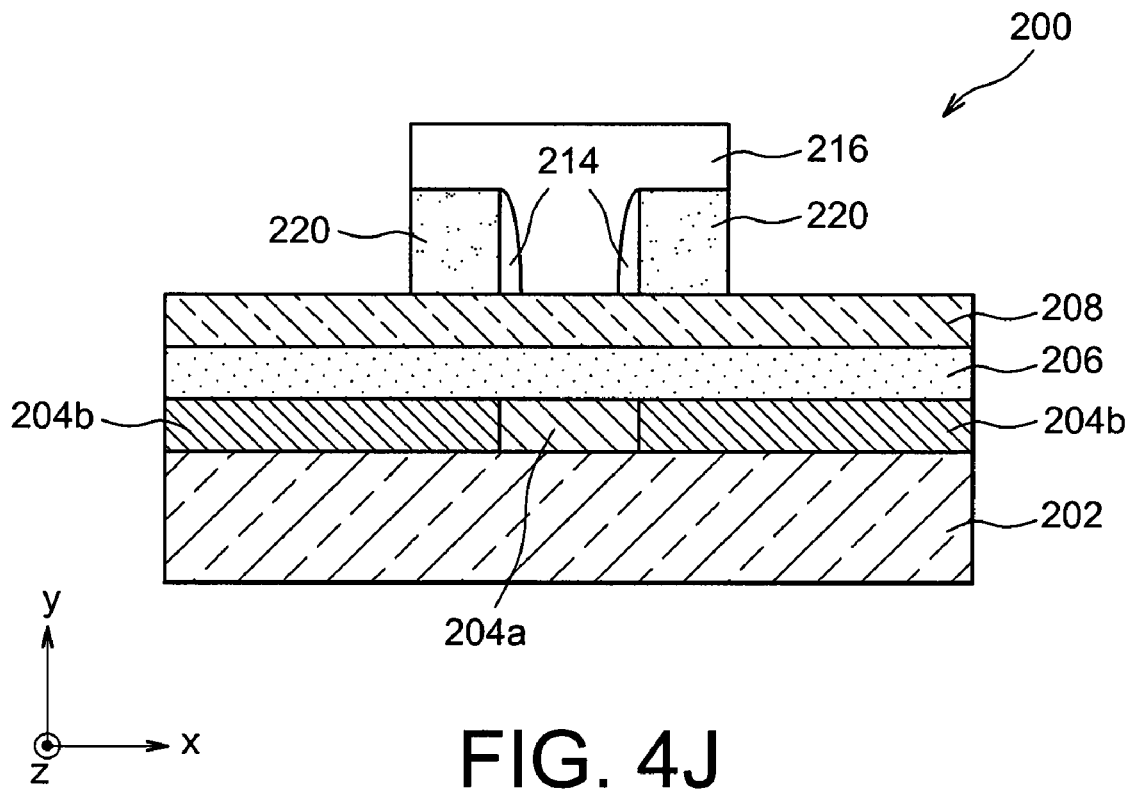
Figure 4K:
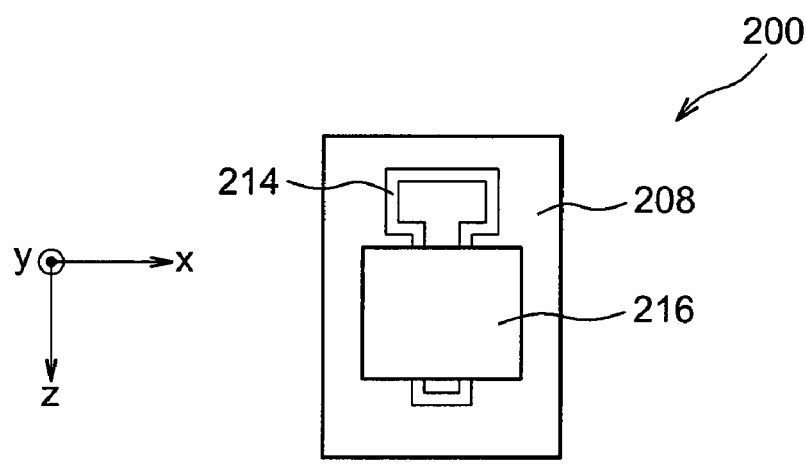
Figure 4L:
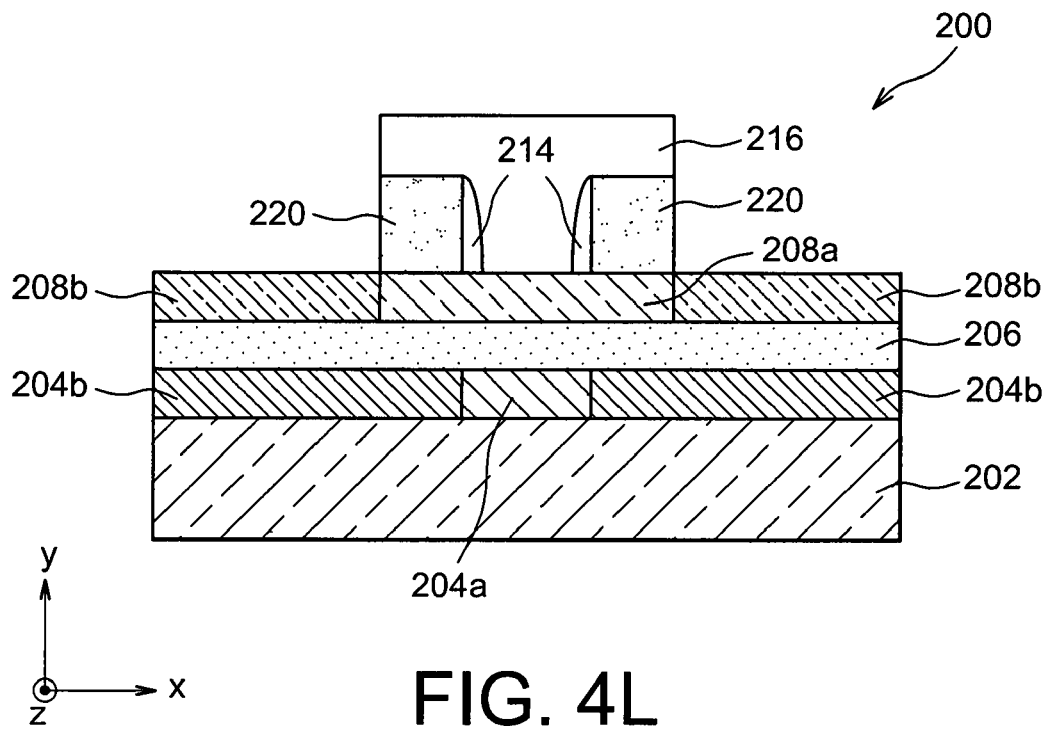
Figure 4M:
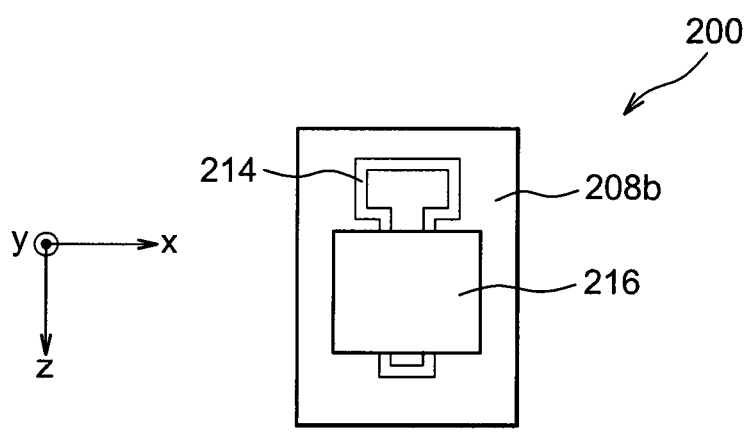
Figure 4N:
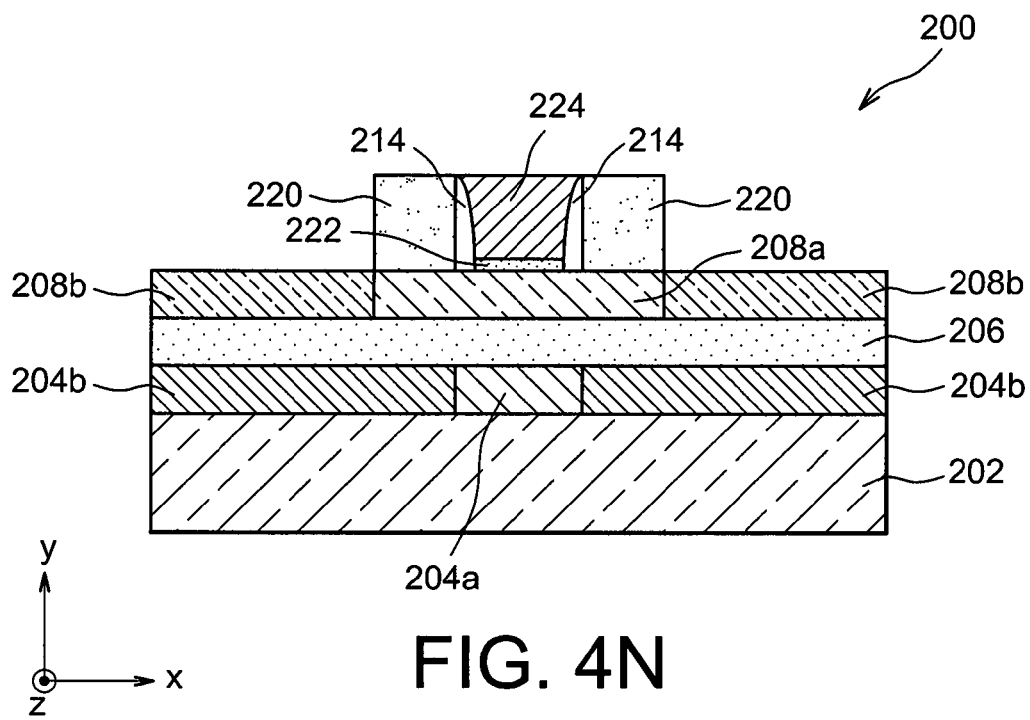
Figure 4O:
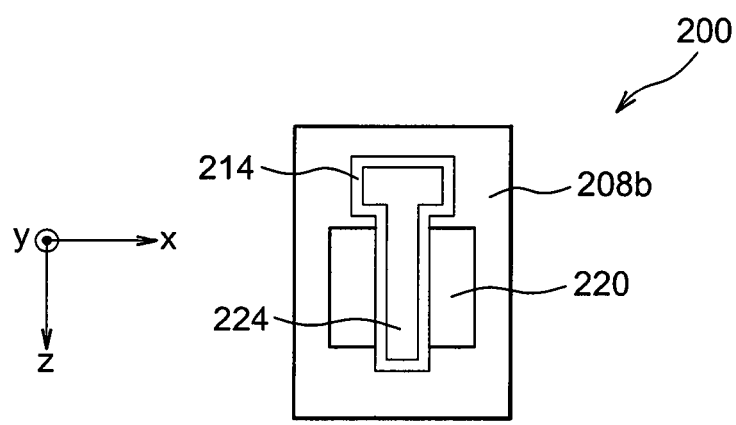
Figure 4P:
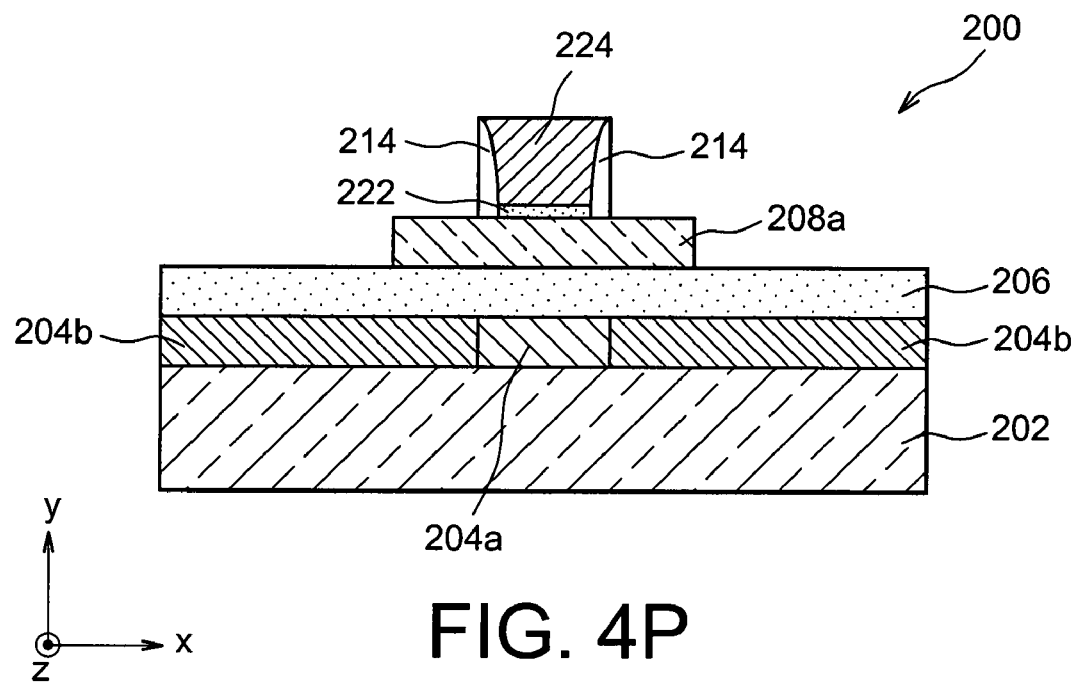
Figure 4Q:
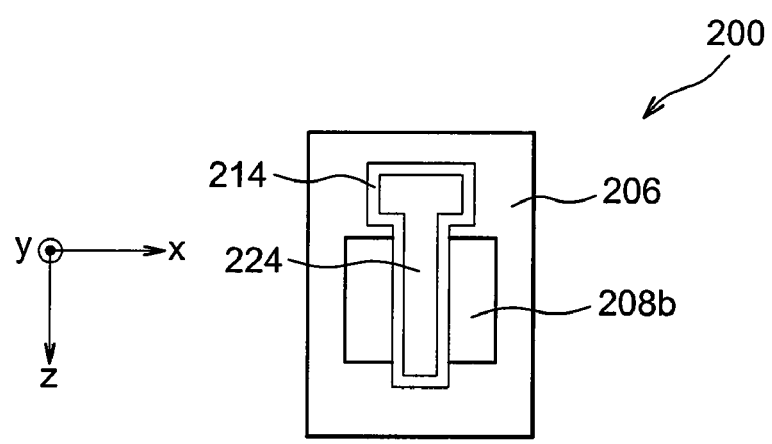
Figure 4R:
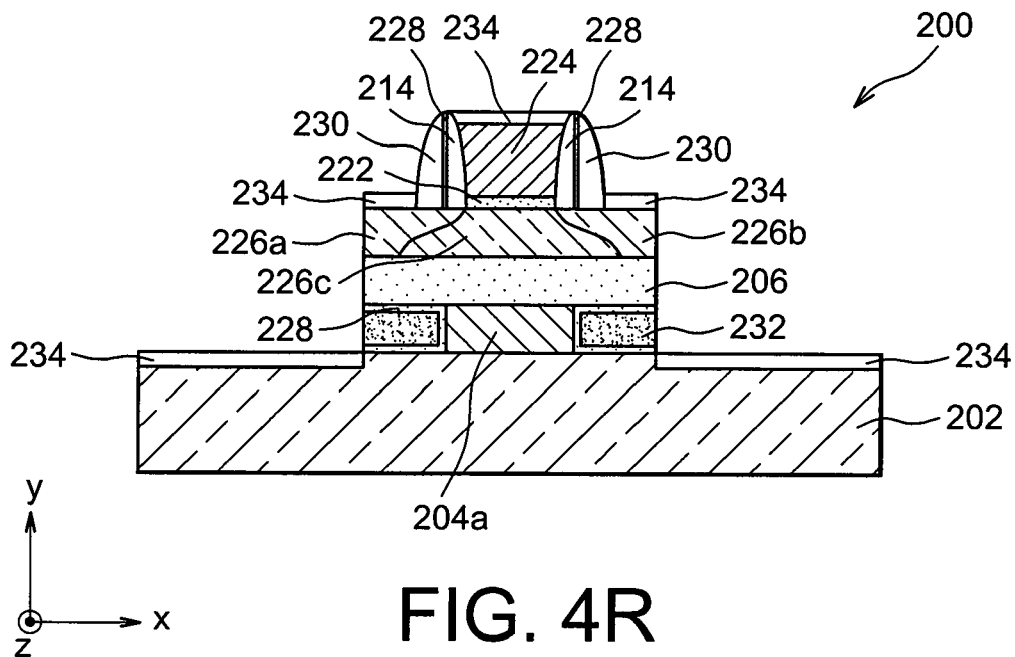
Figure 4S:
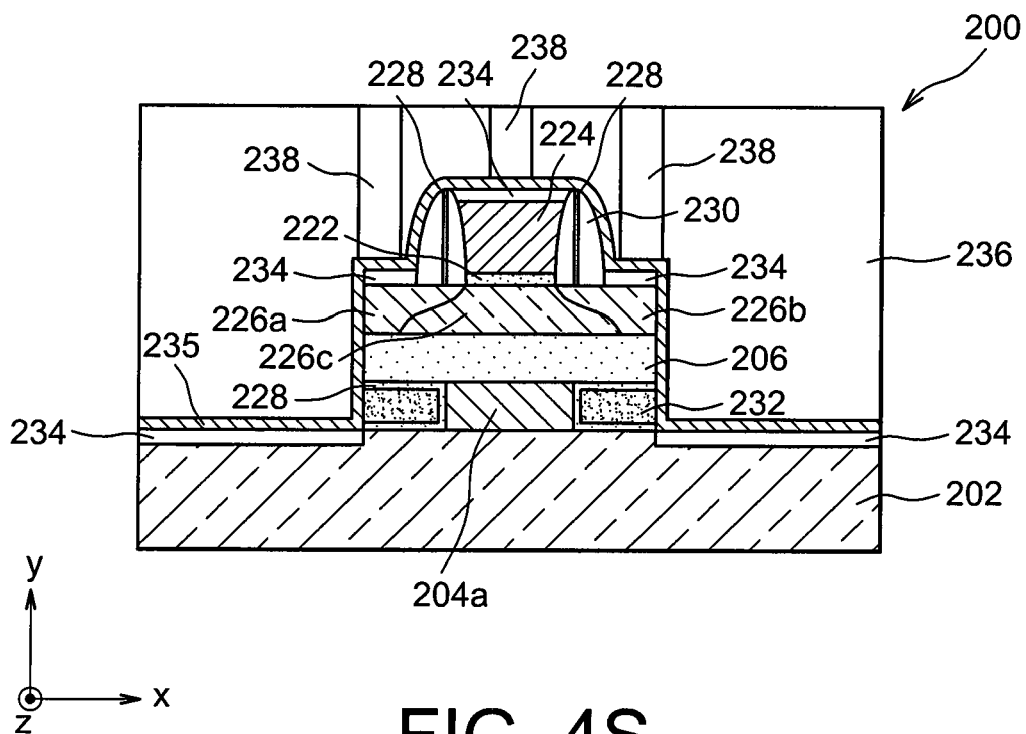
Figure 4T:
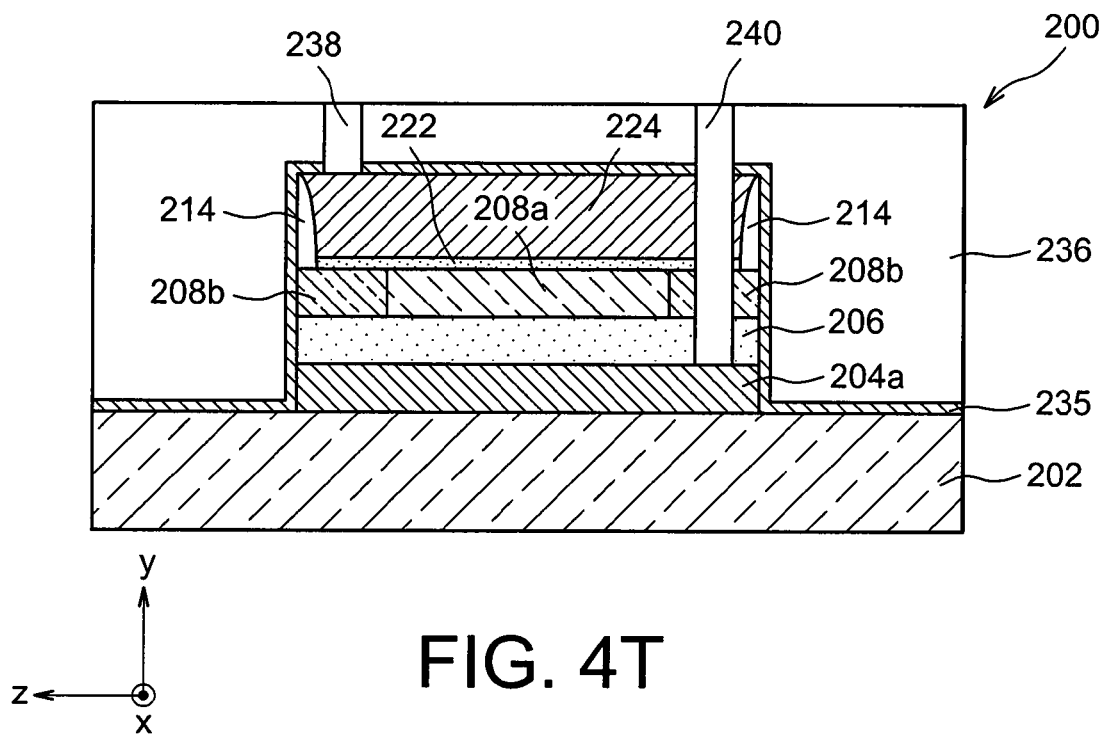
Figure 4U:
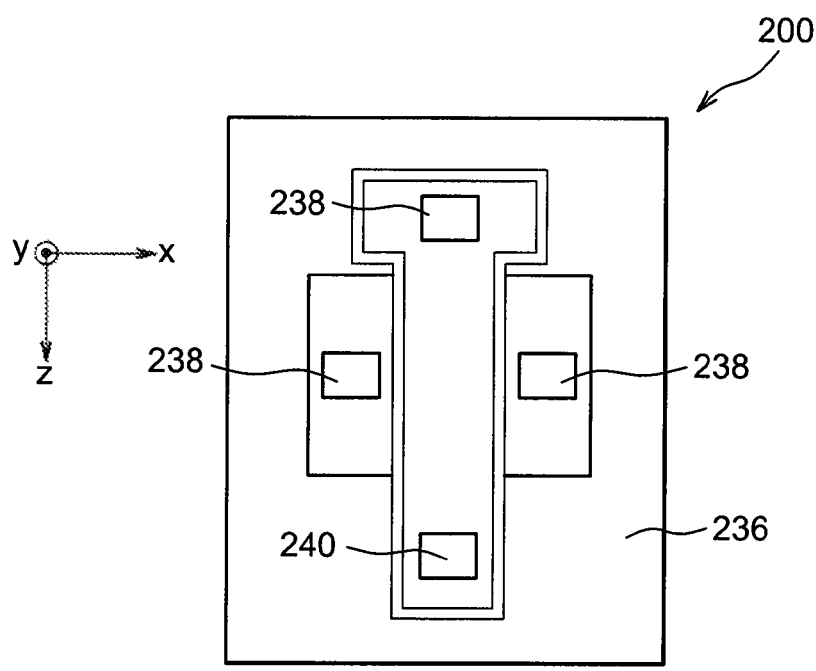

Reference will now be made to FIGS. 4A to 4U representing the steps of a method for making a fully depleted SOI transistor 200, with self-aligned ground plane and gate and buried oxide of variable thickness according to a third embodiment.

As for the first embodiment, firstly is formed, on a substrate 202 for example based on silicon, a photosensitive layer 204 based on an organometallic material, for example similar to the layer 104, by cathodic sputtering, spin coater deposition, hot spraying deposition, or any other deposition technique suited as a function of the organometallic material of layer 204 (FIG. 4A).

A dielectric layer 206, for example similar to the dielectric layer 106, is arranged on the organometallic layer 204. A semi-conductor based layer 208, that may also be similar to the layer 108 described previously, is arranged on the oxide layer 206.

A HSQ resin layer 212 is arranged on the semi-conductor based layer 208. An etch mask 213, the pattern of which may correspond to the future gate of the transistor 200, is formed on the resin layer 212. The pattern of the etch mask 213 may nevertheless be different, particularly in the case of asymmetric devices.

An exposure by electron beam of the device 200 is carried out, forming in the resin layer 212 exposed zones 212a and a non exposed zone 212b corresponding to the pattern of the future gate of the transistor 200. This step forms also in the organometallic layer 204 exposed portions 204b and a non exposed portion 204a, the pattern of which corresponds to that of the mask 213. The mask 213 is then removed from the device 200 (FIGS. 4B and 4C).

As represented in FIGS. 4D and 4E, the non exposed portion 212b of resin is eliminated, for example by development. A spacer 214 is then deposited, for example by PECVD, on the lateral walls of the dielectric portions 212a of exposed resin, in the hollow formed by the removal of the portion of resin 212b.

A material 216 intended to form a hard mask, for example of TEOS (tetraethyl orthosilicate), is deposited over the entire device 200, in other words both in the hollow formed by the removal of the portion of resin 212b and on the remaining dielectric portions 212a (FIGS. 4F and 4G). An etch mask 218 is also formed on the hard mask material 216. The pattern of this etching mask 218 corresponds to the future positions of the source, drain and channel zones, as well as a part of the gate of the transistor 200.

The material 216 is then etched according to the pattern of the mask 218 (FIGS. 4H and 4I). Thus, only the portion of material 216 that is under the etch mask 218 is conserved and forms a hard mask 216.

The dielectric portions 212a stemming from the resin layer 212 are then etched according to the pattern formed by the hard mask 216, the remaining portions 220 of dielectric being conformal to the pattern of the hard mask 216 (FIGS. 4J and 4K).

An oxidation of the portions of the silicon layer 208 not covered by the hard mask 216 is then carried out. Dielectric portions of $SiO_2$ 208b are thus formed. A portion of silicon 208a is conserved under the hard mask 216 (FIGS. 4L and 4M).

As represented in FIGS. 4N and 4O, the etch mask 216 is then eliminated, then a gate dielectric 222 and a gate 224 are formed by deposition and etching in the hollow previously formed by the elimination of the portion of resin 212b. The gate 224 may be formed by a damascene method, as in the second embodiment described previously.

The dielectric portions 220 and 208b are then eliminated for example by etching (FIGS. 4P and 4Q).

Then, as for the previous embodiments, implantation steps are carried out to form source 226a and drain 226b zones in the silicon layer 208. A channel 226c is also formed in the silicon layer 208, under the gate 224. A part of the oxide layer 206 is also etched, forming an access to the organometallic layer 204. Then the exposed portions 204b are etched while leaving remaining uniquely the portion 204a that is under the gate 224 forming a ground plane of the transistor 200 self-aligned with the gate 224. A dielectric based layer 228 is deposited on the spacers 214 as well as on the walls of the hollows formed by the previous removal of the exposed portions 204b. A nitride layer, for example based on silicon nitride, is then deposited on the dielectric layer 228, forming second spacers 230 and portions 232, filling the hollows formed during the removal of the exposed portions 204b. A silicidation of the gate 224, the source and the drain and the substrate 202 is finally carried out, forming portions of silicide 234 (FIG. 4R).

A nitride layer 235 and a pre-metal dielectric (PMD) layer 236 are then deposited on the transistor 200 to achieve its electrical isolation. Metal contacts 238 are then formed to connect the gate 224, the source 226a and the drain 226b. A contact 240 connected to the ground plane 204a is also formed (FIGS. 4S, 4T and 4U).

A fully depleted SOI (FD-SOI) transistor 200 is thus obtained. Thanks to the overlap of the ground plane formed by the portion 204a based on organometallic material under the gate 224, it is possible to form the contact 240 without additional photolithography steps. In addition, the transistor 200 thus formed comprises a buried oxide formed by the layer of $SiO_2$ 206 as well as by the dielectric layer 228 and the portions of nitride 232 deposited in the hollows formed by the removal of the exposed portions 204b of the organometallic layer 204. As in the previous embodiments, this buried oxide has a variable thickness, for example similar to that described in reference to the first embodiment.

In an alternative to the previously described embodiments, the method may be implemented from a double SOI substrate, in other words comprising between the substrate and the organometallic layer, an intermediate dielectric layer, for example based on oxide such as silicon oxide. This alternative may be particularly worthwhile if it is wished not to form silicide directly on the substrate.

The invention claimed is:

1. Method for making a transistor with self-aligned gate and ground plane, comprising:
   a) forming a stack, on one face of a substrate based on at least one semi-conductor, comprising at least one layer based on at least one organometallic material and a layer based on at least one dielectric material,
   b) exposing by electron beams at least one part of the organometallic layer, a portion of the organometallic layer of the exposed part different to the organometallic layer and intended to form a ground plane of the transistor being protected from the electron beams by a mask during this exposure step, a shape and dimensions of a section, in a plane substantially parallel to the face of the substrate, of the gate of the transistor being intended to be substantially equal to the shape and to the dimensions of a section of said portion of organometallic material in said plane,
   c) removing the exposed part of the organometallic layer,
   d) forming dielectric portions in empty spaces formed by the removal of said exposed part of the organometallic layer, between the face of the substrate and the dielectric layer, around said portion of the organometallic layer.

2. The method for making a transistor with self-aligned gate and ground plane according to claim 1, the stack formed in step a) further comprising a layer based on at least one semi-conductor such that the dielectric layer is arranged between said semi-conductor layer and the organometallic layer.

3. The method for making a transistor with self-aligned gate and ground plane according to claim 2, further comprising, between step a) of forming the stack and step b) of exposure, a step of forming the gate of the transistor on the semi-conductor layer, the gate forming the mask protecting the portion of the organometallic layer during step b) of exposure.

4. The method for making a transistor with self-aligned gate and ground plane according to claim 3, further comprising, between the step of forming the gate of the transistor and step b) of exposure, a step of depositing a photosensitive resin layer at least on the gate and on the semi-conductor layer and a step of mechanical-chemical planarisation of the resin layer while stopping on the gate.

5. The method for making a transistor with self-aligned gate and ground plane according to claim 2, further comprising, between step a) of forming the stack and step b) of exposure, a step of depositing a photosensitive resin layer at least on the semi-conductor layer of the stack, step b) also including the exposure of one part of the photosensitive resin layer.

6. The method for making a transistor with self-aligned gate and ground plane according to claim 5, further comprising, between step b) of exposure and step c) of removing the exposed part of the organometallic layer, a step of removing the exposed part of the photosensitive resin layer thus forming, in the resin layer, a hollow, then forming the gate by at least one step of depositing at least one gate material in said hollow and on the resin layer and a step of mechanical-chemical planarisation while stopping on the resin layer.

7. The method for making a transistor with self-aligned gate and ground plane according to claim 4, further comprising, between the step of mechanical-chemical planarisation and step c) of removing the exposed part of the organometallic layer, a step of removing the exposed part of the resin layer.

8. The method for making a transistor with self-aligned gate and ground plane according to claim 2, the stack formed in step a) further comprising a photosensitive resin layer such that the semi-conductor layer is arranged between said resin layer and the dielectric layer.

9. The method for making a transistor with self-aligned gate and ground plane according to claim 8, further comprising, between step a) of forming the stack and step b) of exposure, a step of forming the mask intended to protect the portion of the organometallic layer during step b) of exposure, on the photosensitive resin layer.

10. The method for making a transistor with self-aligned gate and ground plane according to claim 9, step b) of exposure also including the exposure of one part of the photosensitive resin layer, a portion of the photosensitive resin layer, different to said part of the photosensitive resin layer, being protected from the electron beams by the mask during this exposure step, the shape and the dimensions of a section, in a plane substantially parallel to the face of the substrate, of the gate of the transistor being substantially equal to the shape and to the dimensions of a section of said portion of the photosensitive resin layer in said plane.

11. The method for making a transistor with self-aligned gate and ground plane according to claim 10, further comprising, between step b) of exposure and step c) of removing the exposed part of the organometallic layer, a step of removing the non exposed part of the photosensitive resin layer.

12. The method for making a transistor with self-aligned gate and ground plane according to claim 11, further comprising, between the step of removing the non exposed part of the photosensitive resin layer and step c) of removing the exposed part of the organometallic layer, a step of forming at least one spacer against the lateral walls of a hollow formed in the resin layer by the removal of the non exposed part of the resin layer, this spacer being intended to form a contour of the gate of the transistor.

13. The method for making a transistor with self-aligned gate and ground plane according to claim 12, further comprising, between the step of forming the spacer in the hollow formed in the resin layer and step c) of removing the exposed part of the organometallic layer, a step of forming a hard mask opposite a part of the semi-conductor layer intended to comprise the source, drain and channel zones of the transistor, a step of removing parts of the resin layer not covered by the hard mask, then a step of oxidising parts of the semi-conductor layer not covered by the hard mask.

14. The method for making a transistor with self-aligned gate and ground plane according to claim 13, further comprising, between the step of oxidising parts of the semi-conductor layer not covered by the hard mask and step c) of removing the exposed part of the organometallic layer, a step of removing the hard mask, then a step of depositing at least one gate material at least inside the contour formed by the spacer, thus forming the gate of the transistor.

15. The method for making a transistor with self-aligned gate and ground plane according to claim 14, further comprising, between the step of depositing the gate material and step c) of removing the exposed part of the organometallic layer, a step of removing a remaining part of the resin layer and oxidised parts of the semi-conductor layer.

16. The method for making a transistor with self-aligned gate and ground plane according to claim 3, step d) of forming dielectric portions being obtained by the implementation of a step of depositing a first dielectric material at least on the walls of the empty spaces formed by the removal of said exposed part of the organometallic layer and a step of depositing a second dielectric material, different to the first dielectric material, in the remaining space of said empty spaces.

17. The method for making a transistor with self-aligned gate and ground plane according to claim 16, the first and second dielectric materials deposited to form the dielectric portions also being deposited around the gate, thus forming spacers.

18. The method for making a transistor with self-aligned gate and ground plane according to claim 1, the stack formed in step a) further comprising a second dielectric layer arranged between the substrate and the organometallic layer.

19. The method for making a transistor with self-aligned gate and ground plane according to claim 1, further comprising, after step d) of forming dielectric portions, a step of forming at least one electric contact through at least the dielectric layer and the gate of the transistor, connected to the portion of organometallic material.

* * * * *